US012652030B2

(12) United States Patent
Lee

(10) Patent No.: US 12,652,030 B2
(45) Date of Patent: Jun. 9, 2026

(54) CLOCK DOUBLER, A CLOCK GENERATING DEVICE AND A SEMICONDUCTOR SYSTEM USING THE SAME

(71) Applicant: SK hynix Inc., Icheon-si (KR)

(72) Inventor: Jae Whan Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 405 days.

(21) Appl. No.: 18/505,876

(22) Filed: Nov. 9, 2023

(65) Prior Publication Data

US 2025/0015786 A1     Jan. 9, 2025

(30) Foreign Application Priority Data

Jul. 3, 2023     (KR) ........................ 10-2023-0085775

(51) Int. Cl.
H03K 5/00          (2006.01)
H03K 3/037         (2006.01)
H03L 7/08          (2006.01)
(52) U.S. Cl.
CPC ......... H03K 5/00006 (2013.01); H03K 3/037 (2013.01); H03L 7/08 (2013.01)

(58) Field of Classification Search
None
See application file for complete search history.

(56)                References Cited

U.S. PATENT DOCUMENTS 10,998,892  B1      5/2021   Lin
2020/0051602  A1*   2/2020   Ramanathan .......... G11C 7/222
2020/0052680  A1*   2/2020   Ho ......................... G11C 7/222

* cited by examiner

*Primary Examiner* — Cassandra F Cox
(74) *Attorney, Agent, or Firm* — WILLIAM PARK AND ASSOCIATES LTD.

(57)                ABSTRACT

A clock doubler includes a first triggering circuit, a second triggering circuit, and a gating circuit. The first triggering circuit generates a first trigger clock signal using rising edges of a first phase clock signal and a second phase clock signal. The second triggering circuit generates a second trigger clock signal using rising edges of a third phase clock signal and a fourth phase clock signal. The gating circuit gates the first and second trigger clock signals to generate an output clock signal the frequency of which is twice the frequency of clock signals provided to the triggering circuits.

18 Claims, 3 Drawing Sheets

CLOCK DOUBLER, A CLOCK GENERATING DEVICE AND A SEMICONDUCTOR SYSTEM USING THE SAME

CROSS-REFERENCES TO RELATED APPLICATION

The present application claims priority under 35 U.S.C. § 119 (a) to Korean application number 10-2023-0085775, filed on Jul. 3, 2023, in the Korean Intellectual Property Office, which is incorporated herein by reference in its entirety as set forth in full.

BACKGROUND

1. Technical Field

Various embodiments generally relate to an integrated circuit technology, and, more particularly, to a clock doubler, a clock generating device and a semiconductor system using the same.

2. Related Art

An electronic device may include a lot of electronic elements and a computer system, each electronic device including lots of semiconductor apparatuses each apparatus comprising at least one semiconductor. The semiconductor apparatuses comprising the computer system may perform data communication in synchronization with a clock signal. One semiconductor apparatus may transmit data synchronously with the clock signal, and another semiconductor apparatus connected to the one semiconductor apparatus may receive the data synchronously with the clock signal.

In order to improve data communication speeds, the frequency of clock signals used in the computer systems continues to increase. Generally, clock signals with high frequencies have low amplitudes, so improved transmission circuits and improved reception circuits may be required to transmit the high-frequency clock signals through a system bus. An approach that can reduce the burden of transmitting a high-frequency clock signal through a system bus may be to generate a high-frequency clock signal from a clock signal with a lower frequency inside a semiconductor apparatus. Accordingly, the semiconductor apparatuses may include a clock doubler that can generate a clock signal with a higher frequency by multiplying the frequency of the clock signal. In order to ensure the performance of the semiconductor apparatuses, it is necessary that the frequency and duty ratio of the clock signals generated by the doubler are constant.

SUMMARY

Various embodiments may provide a clock doubler, a clock generating device and semiconductor system using the same that can use rising edges of input clock signals to generate output clock signal having a higher frequency than the input clock signals.

In an embodiment, a clock doubler may include a first triggering circuit, a second triggering circuit, and a gating circuit. The first triggering circuit may be configured to generate a first trigger clock signal that transitions from a first logic level to a second logic level in synchronization with a rising edge of a first phase clock signal and transitions from the second logic level to the first logic level in synchronization with a rising edge of a second phase clock signal. The second triggering circuit may be configured to generate a second trigger clock signal that transitions from the first logic level to the second logic level in synchronization with a rising edge of a third phase clock signal and transitions from the second logic level to the first logic level in synchronization with a rising edge of a fourth phase clock signal. The gating circuit may be configured to gate the first and second trigger clock signals to generate an output clock signal.

In an embodiment, a clock doubler may include a first triggering circuit, a second triggering circuit, and a gating circuit. The first triggering circuit may be configured to generate a first trigger clock signal having a pulse enabled during a period from a rising edge of a first phase clock signal to a rising edge of a second phase clock signal. The second triggering circuit may be configured to generate a second trigger clock signal having a pulse enabled during a period from a rising edge of a third phase clock signal to a rising edge of a fourth phase clock signal. The gating circuit may be configured to gate the first and second trigger clock signals to generate an output clock signal.

In an embodiment, a clock doubler may include a first selection circuit, a first synchronization circuit, a second selection circuit, a second synchronization circuit, and a gating circuit. The first selection circuit may be configured to output one of a first phase clock signal and a second phase clock signal as a first synchronization clock signal based on, i.e., responsive to, a complementary signal of a first trigger clock signal. The first synchronization circuit may be configured to output the complementary signal of the first trigger clock signal as the first trigger clock signal based on, i.e., responsive to, the first synchronization clock signal. The second selection circuit may be configured to output one of a third phase clock signal and a fourth phase clock signal as a second synchronization clock signal based on, i.e., responsive to, a complementary signal of a second trigger clock signal. The second synchronization circuit may be configured to output the complementary signal of the second trigger clock signal as the second trigger clock signal based on, i.e., responsive to, the second synchronization clock signal. The gating circuit may be configured to gate the first and second trigger clock signals to generate an output clock signal.

In an embodiment, a clock doubler may include a first multiplexer, a first flip-flop, a second multiplexer, a second flip-flop, and a NAND gate. The first multiplexer may be configured to output one of a first phase clock signal and a second phase clock signal as a first synchronization clock signal based on, i.e., responsive to, a complementary signal of a first trigger clock signal. The first flip-flop may be configured to include a clock terminal receiving the first synchronization clock signal, a negative output terminal outputting the complementary signal of the first trigger clock signal, an input terminal coupled with the negative output terminal, and a positive output terminal outputting the first trigger clock signal. The second multiplexer may be configured to output one of a third phase clock signal and a fourth phase clock signal as a second synchronization clock signal based on, i.e., responsive to, a complementary signal of a second trigger clock signal. The second flip-flop may be configured to include a clock terminal receiving the second synchronization clock signal, a negative output terminal outputting the complementary signal of the second trigger clock signal, an input terminal coupled with the negative output terminal, and a positive output terminal outputting the second trigger clock signal. The NAND gate may be configured to receive the first and second trigger clock signals to output an output clock signal.

Various embodiments can generate an output clock signal having a stable frequency and duty ratio independent of the duty cycle of the input clock signal, thereby improving the performance and reliability of a semiconductor apparatus and a semiconductor system.

DETAILED DESCRIPTION

Figure 1:
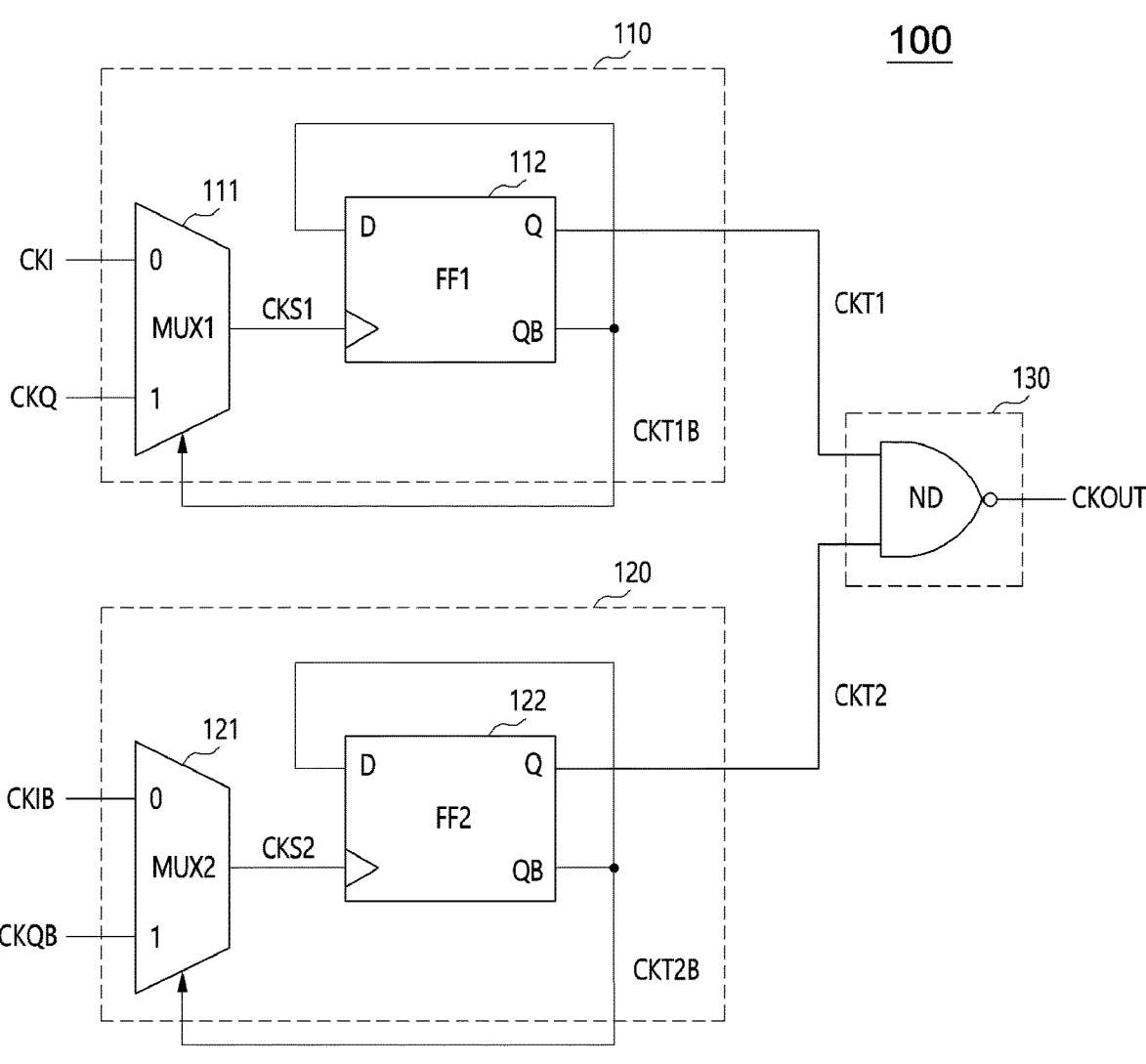
FIG. 1 is a diagram illustrating a configuration of a clock doubler according to an embodiment.

FIG. 1 is a diagram illustrating a configuration of a clock doubler 100 according to an embodiment. Referring to FIG. 1, the clock doubler 100 may receive a plurality of input clock signals having a constant phase difference to generate an output clock signal CKOUT. The clock doubler 100 may generate the output clock signal CKOUT having a frequency that is twice as high as the plurality of input clock signals.

The clock doubler 100 may receive a first phase clock signal CKI, a second phase clock signal CKQ, a third phase clock signal CKIB, and a fourth phase clock signal CKQB as the plurality of input clock signals. The first to fourth phase clock signals CKI, CKQ, CKIB, CKQB may have the same first frequency, and may have a sequentially constant phase difference. Stated another way, the first to fourth phase clock signals CKI, CKQ, CKIB, CKQB are separated by the same phase angle difference. The first to fourth phase clock signals thus have a sequentially constant phase difference. For example, the first phase clock signal CKI may have a leading phase of 90 degrees relative to the second phase clock signal CKQ. The second phase clock signal CKQ may have a leading phase of 90 degrees relative to the third phase clock signal CKIB. The third phase clock signal CKIB may have a leading phase of 90 degrees relative to the fourth phase clock signal CKQB. The fourth phase clock signal CKQB may have a leading phase of 90 degrees relative to the first phase clock signal CKI by 90 degrees. The output clock signal CKOUT may have a second frequency, which is twice the first frequency.

Figure 2:
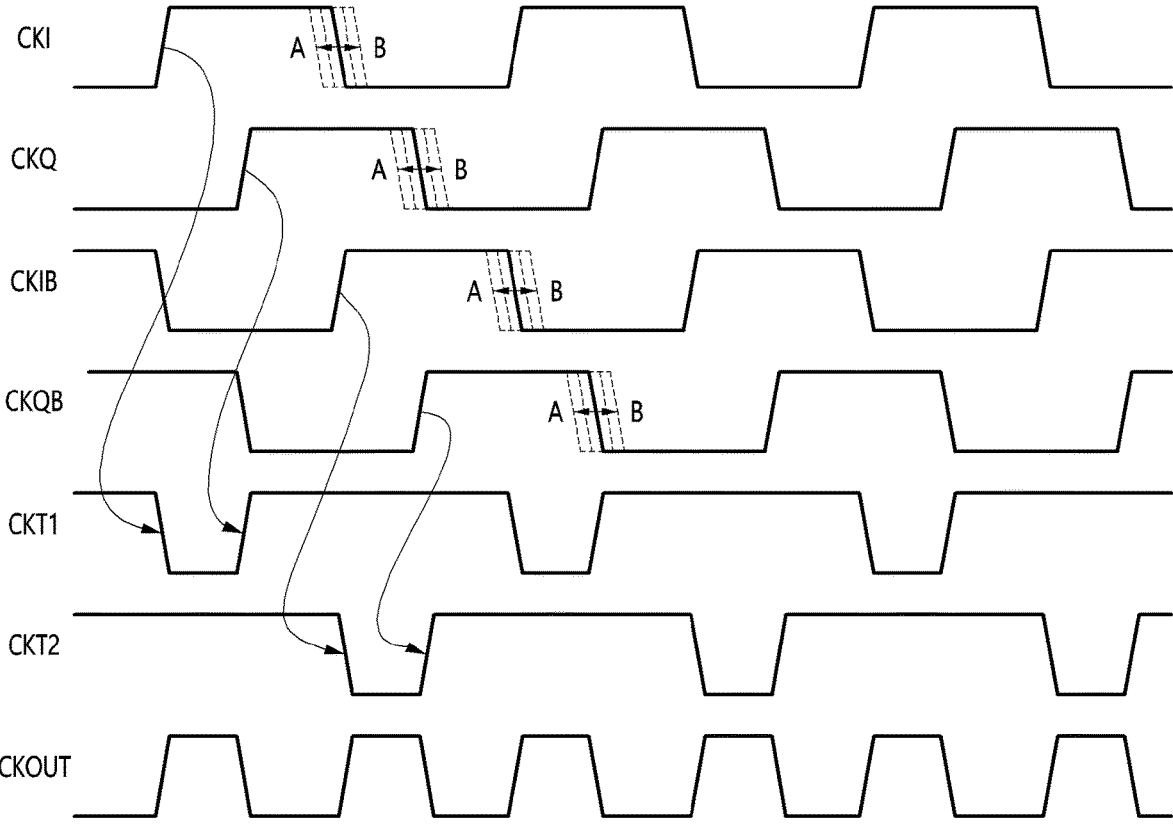
FIG. 2 is a timing diagram illustrating an operation of a clock doubler according to an embodiment.

As shown in FIG. 2, the clock doubler 100 may generate the output clock signal CKOUT based on, i.e., responsive to, a rising edge of the first to fourth phase clock signals CKI, CKQ, CKIB, CKQB. The clock doubler 100 may transition the output clock signal CKOUT from one logic level to the other whenever a rising edge of the first to fourth phase clock signals CKI, CKQ, CKIB, CKQB occurs. The clock doubler 100 uses the rising edges of the first to fourth phase clock signals CKI, CKQ, CKIB, CKQB to generate the output clock signal CKOUT. Thus, it may be possible to generate the output clock signal CKOUT that depends only on the phase difference between the first to fourth phase clock signals CKI, CKQ, CKIB, CKQB and might not depend on the duty cycle of the first to fourth phase clock signals CKI, CKQ, CKIB, CKQB. If the phase difference between the first to fourth phase clock signals CKI, CKQ, CKIB, CKQB may be consistently maintained, the clock doubler 100 can generate the output clock signal CKOUT having a constant frequency and a duty ratio of 50:50.

Referring again to FIG. 1, the clock doubler 100 may include a first triggering circuit 110, a second triggering circuit 120, and a gating circuit 130. The first triggering circuit 110 may receive the first phase clock signal CKI and the second phase clock signal CKQ, and may generate a first trigger clock signal CKT1 and a complementary signal of the first trigger clock signal CKT1B. The first triggering circuit 110 may generate the first trigger clock signal CKT1 having a pulse that is enabled during a period from a rising edge of the first phase clock signal CKI to a rising edge of the second phase clock signal CKQ. The first triggering circuit 110 may change the logic level of the first trigger clock signal CKT1 based on the rising edges of the first and second phase clock signals CKI, CKQ. The first triggering circuit 110 may transition the first trigger clock signal CKT1 from a first logic level to a second logic level synchronously with the rising edge of the first phase clock signal CKI. The first triggering circuit 110 may transition the first trigger clock signal CKT1 from the second logic level to the first logic level synchronously with a rising edge of the second phase clock signal CKQ. The first triggering circuit 110 may generate the first trigger clock signal CKT1 having the same frequency as the first and second phase clock signals CKI, CKQ, and having a narrower pulse width than the first and second phase clock signals CKI, CKQ.

The second triggering circuit 120 may receive the third phase clock signal CKIB and the fourth phase clock signal CKQB, and may generate a second trigger clock signal CKT2 and a complementary signal of the second trigger clock signal CK2TB. The second triggering circuit 120 may generate the second trigger clock signal CKT2 having a pulse that is enabled during a period from a rising edge of the third phase clock signal CKIB to a rising edge of the fourth phase clock signal CKQB. The second triggering circuit 120 may change the logic level of the second trigger clock signal CKT2 based on the rising edges of the third and fourth phase clock signals CKIB, CKQB. The second triggering circuit 120 may transition the second trigger clock signal CKT2 from the first logic level to the second logic level synchronously with a rising edge of the third phase clock signal CKIB. The second triggering circuit 120 may transition the second trigger clock signal CKT2 from the second logic level to the first logic level synchronously with a rising edge of the fourth phase clock signal CKQB. The second triggering circuit 120 may generate the second trigger clock signal CKT2 having the same frequency as the third and fourth phase clock signals CKIB, CKQB, and having a narrower pulse width than the third and fourth phase clock signals CKIB, CKQB.

The gating circuit 130 may receive the first trigger clock signal CKT1 and the second trigger clock signal CKT2. The gating circuit 130 may generate the output clock signal CKOUT based on the first and second trigger clock signals CKT1, CKT2. The gating circuit 130 may generate a pulse of the output clock signal CKOUT whenever pulses of the first and second trigger clock signals CKT1, CKT2 are generated. The gating circuit 130 may output both pulses of the first and second trigger clock signals CKT1, CKT2 as pulses of the output clock signal CKOUT. The gating circuit 130 may change the logic level of the output clock signal CKOUT when the logic level of the first trigger clock signal CKT1 changes, and may change the logic level of the output clock signal CKOUT when the logic level of the second trigger clock signal CKT2 changes. Because pulses of the output clock signal CKOUT are generated based on pulses of both the first and second trigger clock signals CKT1, CKT2, the gating circuit 130 may generate the output clock signal CKOUT having a frequency of twice that of the first to fourth phase clock signals CKI, CKQ, CKIB, CKQB.

The first triggering circuit 110 may include a first selection circuit 111 and a first synchronization circuit 112. The first selection circuit 111 may receive the first phase clock signal CKI and the second phase clock signal CKQ. Further, the first selection circuit 111 may receive the complementary signal of the first trigger clock signal CKT1B. The first selection circuit 111 may generate a first synchronization clock signal CKS1 based on the first phase clock signal CKI, the second phase clock signal CKQ, and the complementary signal of the first trigger clock signal CKT1B. The first selection circuit 111 may output one of the first and second phase clock signals CKI, CKQ as the first synchronization clock signal CKS1 based on the complementary signal of the first trigger clock signal CKT1B. For example, the first selection circuit 111 may output the first phase clock signal CKI as the first synchronization clock signal CKS1 when the complementary signal of the first trigger clock signal CKT1B is at a low logic level. The first selection circuit 111 may output the second phase clock signal CKQ as the first synchronization clock signal CKS1 when the complementary signal of the first trigger clock signal CKT1B is at a high logic level.

The first selection circuit 111 may include a first multiplexer MUX1. A first input terminal of the first multiplexer MUX1 may receive the first phase clock signal CKI, and a second input terminal of the first multiplexer MUX1 may receive the second phase clock signal CKQ. The first multiplexer MUX1 may receive the complementary signal of the first trigger clock signal CKT1B as a control signal, and the first synchronization clock signal CKS1 may be output from an output terminal of the first multiplexer MUX1.

The first synchronization circuit 112 may receive the first synchronization clock signal CKS1 from the first selection circuit 111. The first synchronization circuit 112 may generate the first trigger clock signal CKT1 and the complementary signal of the first trigger clock signal CKT1B based on the first synchronization clock signal CKS1. The first synchronization circuit 112 may output the complementary signal of the first trigger clock signal CKT1B based on the first synchronization clock signal CKS1 as the first trigger clock signal CKT1. The first synchronization circuit 112 may change the logic level of the first trigger clock signal CKT1 and the complementary signal of the first trigger clock signal CKT1B in synchronization with the rising edge of the first synchronization clock signal CKS1. The first synchronization circuit 112 may change the logic level of the first trigger clock signal CKT1 from one logic level to the other whenever a rising edge of the first synchronization clock signal CKS1 occurs. When the first phase clock signal CKI is output as the first synchronization clock signal CKS1, the first synchronization circuit 112 may change the first trigger clock signal CKT1 from the first logic level to the second logic level in synchronization with the rising edge of the first phase clock signal CKI. When the second phase clock signal CKQ is output as the first synchronization clock signal CKS1, the first synchronization circuit 112 may transition the first trigger clock signal CKT1 from the second logic level to the first logic level in synchronization with the rising edge of the second phase clock signal CKQ. The first synchronization circuit 112 may comprise a first flip-flop FF. A clock terminal of the first flip-flop FF may receive the first synchronization clock signal CKS1. The complementary signal of the first trigger clock signal CKT1B may be output from the negative output terminal QB of the first flip-flop FF. The input terminal D of the first flip-flop FF may be coupled with the negative output terminal QB. The first trigger clock signal CKT1 may be output from the positive output terminal Q of the first flip-flop FF. The first flip-flop FF may be a D flip-flop.

The second triggering circuit 120 may include a second selection circuit 121 and a second synchronization circuit 122. The second selection circuit 121 may receive the third phase clock signal CKIB and the fourth phase clock signal CKQB. Further, the second selection circuit 121 may receive the complementary signal CK2TB of the second trigger clock signal. The second selection circuit 121 may generate a second synchronization clock signal CKS2 based on the third phase clock signal CKIB, the fourth phase clock signal CKQB, and the complementary signal of the second trigger clock signal CKT2B. The second selection circuit 121 may output one of the third and fourth phase clock signals CKIB, CKQB as the second synchronization clock signal CKS2 based on the complementary signal of the second trigger clock signal CKT2B. For example, the second selection circuit 121 may output the third phase clock signal CKIB as the second synchronization clock signal CKS2 when the complementary signal of the second trigger clock signal CKT2B is at a low logic level. The second selection circuit 121 may output the fourth phase clock signal CKQB as the second synchronization clock signal CKS2 when the complementary signal of the second trigger clock signal CKT2B is at a high logic level. The second selection circuit 121 may comprise a second multiplexer MUX2. A first input terminal of the second multiplexer MUX2 may receive the third phase clock signal CKIB, and a second input terminal of the second multiplexer MUX2 may receive the fourth phase clock signal CKQB. The second multiplexer MUX2 may receive the complementary signal of the second trigger clock signal CKT2B as a control signal, and the second synchronization clock signal CKS2 may be output from an output terminal of the second multiplexer MUX2.

The second synchronization circuit 122 may receive the second synchronization clock signal CKS2 from the second selection circuit 121. The second synchronization circuit 122 may generate the second trigger clock signal CKT2 and the complementary signal of the second trigger clock signal CKT2B based on the second synchronization clock signal CKS2. The second synchronization circuit 122 may output the complementary signal of the second trigger clock signal CKT2B as the second trigger clock signal CKT2 based on the second synchronization clock signal CKS2. The second synchronization circuit 122 may change the logic level of the second trigger clock signal CKT2 and the complementary signal of the second trigger clock signal CKT2B in synchronization with the rising edge of the second synchronization clock signal CKS2. The second synchronization circuit 122 may change the logic level of the second trigger clock signal CKT2 from one logic level to the other whenever a rising edge of the second synchronization clock signal CKS2 occurs. When the third phase clock signal CKIB is output as the second synchronization clock signal CKS2, the second synchronization circuit 122 may change the second trigger clock signal CKT2 from the first logic level to the second logic level in synchronization with the rising edge of the third phase clock signal CKIB. When the fourth phase clock signal CKQB is output as the second synchronization clock signal CKS2, the second synchronization circuit 122 may transition the second trigger clock signal CKT2 from the second logic level to the first logic level synchronously with the rising edge of the fourth phase clock signal CKQB.

The second synchronization circuit 122 may comprise a second flip-flop FF2. A clock terminal of the second flip-flop FF2 may receive the second synchronization clock signal CKS2. The complementary signal of the second trigger clock signal CKT2B may be output from the negative output terminal QB of the second flip-flop FF2. The input terminal D of the second flip-flop FF2 may be coupled with the negative output terminal QB. The second trigger clock signal CKT2 may be output from the positive output terminal Q of the second flip-flop FF2. The second flip-flop FF2 may be a D flip-flop.

The gating circuit 130 may comprise a NAND gate ND. A first input terminal of the NAND gate ND may receive the first trigger clock signal CKT1, and a second input terminal of the NAND gate ND may receive the second trigger clock signal CKT2. The output clock signal CKOUT may be output from the output terminal of the NAND gate ND.

FIG. 2 is a timing diagram illustrating the operation of the clock doubler 100 according to an embodiment. Referring to FIGS. 1 and 2, the operation of the clock doubler 100 according to an embodiment will be described as follows. The first to fourth phase clock signals CKI, CKQ, CKIB, CKQB may be provided to the clock doubler 100 with a phase difference of 90 degrees sequentially. The first and second trigger clock signals CKT1, CKT2 may be in a default state and may have a high logic level. The complementary signal of the first trigger clock signal CKT1B and the complementary signal of the second trigger clock signal CKT2B may have a low logic level. The first selection circuit 111 may output the first phase clock signal CKI as the first synchronization clock signal CKS1, and the second selection circuit 121 may output the third phase clock signal CKIB as the second synchronization clock signal CKS2.

When a rising edge of the first phase clock signal CKI occurs, the first synchronization circuit 112 may output the complementary signal of the first trigger clock signal CKT1B as the first trigger clock signal CKT1, and the first trigger clock signal CKT1 may transition from a high logic level to a low logic level. The complementary signal of the first trigger clock signal CKT1B may transition from a low logic level to a high logic level, and the first selection circuit 111 may output the second phase clock signal CKQ instead of the first phase clock signal CKI as the first synchronization clock signal CKS1. When a rising edge of the second phase clock signal CKQ occurs, the first synchronization circuit 112 may output the complementary signal of the first trigger clock signal CKT1B as the first trigger clock signal CKT1, and the first trigger clock signal CKT1 may transition from a low logic level to a high logic level. The complementary signal of the first trigger clock signal CKT1B may transition from a high logic level to a low logic level, and the first selection circuit 111 may output the first phase clock signal CKI again as the first synchronization clock signal CKS1. Thus, the first trigger clock signal CKT1 may have a pulse that is enabled at a low logic level during a period from a rising edge of the first phase clock signal CKI to a rising edge of the second phase clock signal CKQ. Whenever the rising edges of the first and second phase clock signals CKI, CKQ occur successively, pulses of the first trigger clock signal CKT1 may be generated successively. The first trigger clock signal CKT1 may have a frequency substantially equal to the frequency of the first and second phase clock signals CKI, CKQ, and may have a pulse width corresponding to half of the pulse width of the first and second phase clock signals CKI, CKQ.

When a rising edge of the third phase clock signal CKIB occurs, the second synchronization circuit 122 may output the complementary signal of the second trigger clock signal CKT2B as the second trigger clock signal CKT2, and the second trigger clock signal CKT2 may be transitioned from a high logic level to a low logic level. The complementary signal of the second trigger clock signal CKT2B may transition from a low logic level to a high logic level, and the second selection circuit 121 may output the fourth phase clock signal CKQB instead of the third phase clock signal CKIB as the second synchronization clock signal CKS2. When a rising edge of the fourth phase clock signal CKQB occurs, the second synchronization circuit 122 may output the complementary signal of the second trigger clock signal CKT2B as the second trigger clock signal CKT2, and the second trigger clock signal CKT2 may transition from a low logic level to a high logic level. The complementary signal of the second trigger clock signal CKT2B may transition from the high logic level to the low logic level, and the second selection circuit 121 may output the third phase clock signal CKIB again as the second synchronization clock signal CKS2. Thus, the second trigger clock signal CKT2 may have a pulse that is enabled at a low logic level during a period from the rising edge of the third phase clock signal CKIB to the rising edge of the fourth phase clock signal CKQB. Whenever the rising edges of the third and fourth phase clock signals CKIB, CKQB occur successively, pulses of the second trigger clock signal CKT2 may be generated successively. The second trigger clock signal CKT2 may have a frequency substantially equal to the frequency of the third and fourth phase clock signals CKIB, CKQB, and may have a pulse width corresponding to half of the pulse width of the third and fourth phase clock signals CKIB, CKQB.

The gating circuit 130 may receive the first trigger clock signal CKT1 and the second trigger clock signal CKT2. The gating circuit 130 may generate pulses of the output clock signal CKOUT whenever pulses of the first and second trigger clock signals CKT1, CKT2 are generated. Each time a pulse of the first trigger clock signal CKT1 and the second trigger clock signal CKT2 is enabled, the gating circuit 130 may generate the output clock signal CKOUT having a pulse enabled at a high logic level. Thus, the pulse width of the output clock signal CKOUT may be half the pulse width of the first to fourth phase clock signals CKI, CKQ, CKIB, CKQB, and the frequency of the output clock signal CKOUT may be twice the frequency of the first to fourth phase clock signals CKI, CKQ, CKIB, CKQB. Because the clock doubler 100 uses the rising edges of the first to fourth phase clock signals CKI, CKQ, CKIB, CKQB to generate the output clock signal CKOUT, the duty ratio of the output clock signal CKOUT can be maintained at 50:50 regardless of the duty cycle of the first to fourth phase clock signals CKI, CKQ, CKIB, CKQB. Because the clock doubler 100 does not use falling edges of the first to fourth phase clock signals CKI, CKQ, CKIB, CKQB to generate the output clock signal CKOUT, it is possible to generate the output clock signal CKOUT having a constant frequency and duty ratio even if the interval of the high logic level of the first to fourth phase clock signals CKI, CKQ, CKIB, CKQB is short (in case A) or long (in case B).

Figure 3:
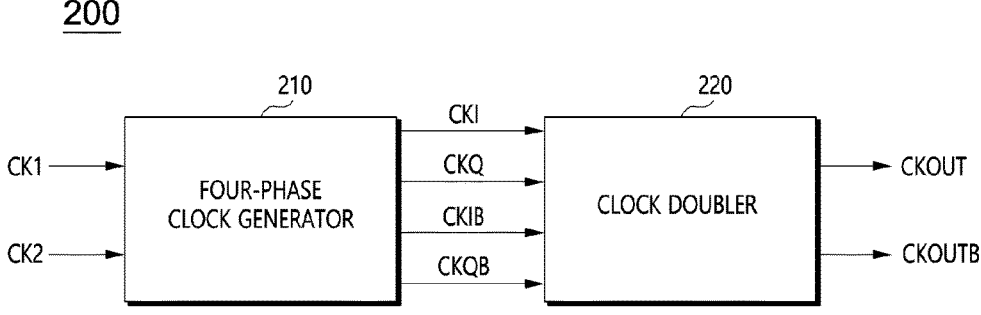
FIG. 3 is a block diagram illustrating a configuration of a clock generating device according to an embodiment.

FIG. 3 is a block diagram illustrating the configuration of a clock generating circuit 200 according to an embodiment. Referring to FIG. 3, the clock generating circuit 200 may include a four-phase clock generator 210 and a clock doubler 220. The four-phase clock generator 210 may receive a first clock signal CK1 and a second clock signal CK2. The four-phase clock generator 210 may generate a first phase clock signal CKI, a second phase clock signal CKQ, a third phase clock signal CKIB, and a fourth phase clock signal CKQB based on the first and second clock signals CK1, CK2. The second clock signal CK2 may be a differential signal of the first clock signal CK1. In one embodiment, the second clock signal CK2 may have a lagging phase of 90 degrees to the first clock signal CK1. The first to fourth phase clock signals CKI, CKQ, CKIB, CKQB may have a sequentially constant phase difference. The frequency of the first to fourth phase clock signals CKI, CKQ, CKIB, CKQB may be substantially the same as the first and second clock signals CK1, CK2. In one embodiment, the four phase clock generator 210 may comprise delay circuit and/or phase interpolation circuit to generate the first to fourth phase clock signals CKI, CKQ, CKIB, CKQB from the first and second clock signals CK1, CK2. In one embodiment, the four phase clock generator 210 may generate the first to fourth phase clock signals CKI, CKQ, CKIB, CKQB having a constant phase difference using an asynchronous delay method. In one embodiment, the four phase clock generator 210 may generate the first to fourth phase clock signals CKI, CKQ, CKIB, CKQB having a constant phase difference using rising edges of the first and second clock signals CK1, CK2 having a phase difference of 90 degrees.

The clock doubler 220 may receive the first to fourth phase clock signals CKI, CKQ, CKIB, CKQB from the four phase clock generator 210. The clock doubler 220 may generate an output clock signal CKOUT based on the first to fourth phase clock signals CKI, CKQ, CKIB, CKQB. The clock doubler 220 may use the rising edges of the first to fourth phase clock signals CKI, CKQ, CKIB, CKQB to generate the output clock signal CKOUT having a frequency twice as high as the first to fourth phase clock signals CKI, CKQ, CKIB, CKQB and having a constant duty ratio. The clock doubler 220 may also output a complementary signal CKOUTB of the output clock signal along with the output clock signal CKOUT. The clock doubler 100 illustrated in FIG. 1 may be applied as the clock doubler 220.

Figure 4:
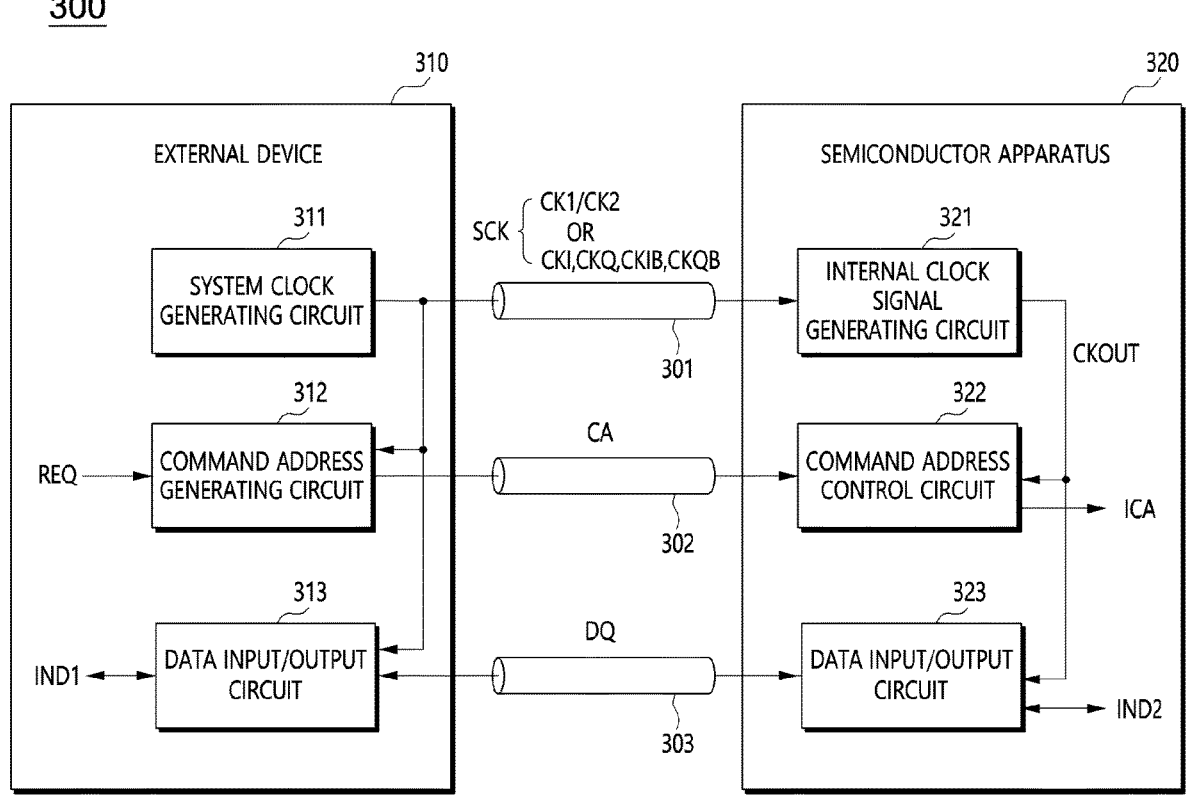
FIG. 4 is a block diagram illustrating a configuration of a semiconductor system according to an embodiment.

FIG. 4 is a block diagram illustrating a configuration of a semiconductor system 300 according to an embodiment. Referring to FIG. 4, the semiconductor system 300 may include an external device 310 and a semiconductor apparatus 320. The external device 310 may be a master device that provides various control signals required for the semiconductor apparatus 320 to operate. The semiconductor apparatus 320 may be a slave device that is controlled by the external device 310 to perform various operations. The external device 310 may include various types of host devices. For example, the external device 310 may be a host device such as a central processing unit (CPU), a graphic processing unit (GPU), a multi-media processor (MMP), a digital signal processor, an application processor (AP), and a memory controller. Further, the external device 310 may be a test device or test equipment for testing the semiconductor apparatus 320. The semiconductor apparatus 320 may be, for example, a memory device, and the memory device may include volatile memory and non-volatile memory. The volatile memory may include SRAM (Static RAM), DRAM (Dynamic RAM), SDRAM (Synchronous DRAM), and the non-volatile memory may include ROM (Read Only Memory), PROM (Programmable ROM), EEPROM (Electrically Erasable and Programmable ROM), EPROM (Erasable Programmable ROM), flash memory, PRAM (Phase change RAM), MRAM (Magnetic RAM), RRAM (Resistive RAM), and FRAM (Ferroelectric RAM).

The semiconductor apparatus 320 may be connected to the external device 310, which functions as the test equipment, to perform test operations. The semiconductor apparatus 320 may be connected with the external device 310 functioning as the host device to perform various operations other than the test operations. For example, after the semiconductor apparatus 320 is manufactured, the semiconductor apparatus 320 may be tested in connection with the external device 310 functioning as the test equipment. After the test is completed, the semiconductor apparatus 320 may be connected to the external device 310 functioning as the host device to perform various operations.

The semiconductor apparatus 320 may be connected to the external device 310 through a plurality of buses. The plurality of buses may be signal transmission paths, links or channels for transmitting signals. The plurality of buses may include a clock bus 301, a command address bus 302, and a data bus 303. The clock bus 301 and command address bus 302 may be unidirectional buses from the external device 310 to the semiconductor apparatus 320, and the data bus 303 may be a bidirectional bus. The clock bus 301, the command address bus 302, and the data bus 303 may each include a plurality of signal transmission lines. The semiconductor apparatus 320 may be connected to the external device 310 through the clock bus 301, and may receive a system clock signal SCK through the clock bus 301. The system clock signal SCK may comprise one or more pairs of clock signals. For example, the external device 310 may transmit a first clock signal CK1 and a second clock signal CK2 as the system clock signal SCK through the clock bus 301. The second clock signal CK2 may be a complementary signal of the first clock signal CK1, or may be a clock signal having a phase difference of 90 degrees from the first clock signal CK1. In one embodiment, the external device 310 may transmit the first phase clock signal CKI, the second phase clock signal CKQ, the third phase clock signal CKIB, and the fourth phase clock signal CKQB through the clock bus 301 as the system clock signal SCK. The first to fourth phase clock signals CKI, CKQ, CKIB, CKQB may have a phase difference of 90 degrees sequentially. The system clock signal SCK may have a first frequency.

The external device 310 may transmit a command address signal CA to the semiconductor apparatus 320 through the command address bus 302, and the semiconductor apparatus 320 may receive the command address signal CA through the command address bus 302. The command address signal CA may include a command signal and an address signal, and may include a plurality of bits. The external device 310 may transmit the command address signal CA to the semiconductor apparatus 320 in synchronization with the system clock signal SCK. The semiconductor apparatus 320 may receive the command address signal CA based on the system clock signal SCK. The semiconductor apparatus 320 may be connected to the external device 310 through the data bus 303, and may receive data DQ from the external device 310 and/or transmit data DQ to the external device 310 through the data bus 303. The external device 310 may transmit the data DQ to the semiconductor apparatus 320 in synchronization with the system clock signal SCK. The semiconductor apparatus 320 may transmit the data DQ to the external device 310 based on the system clock signal SCK, or may receive the data DQ transmitted from the external device 310.

The external device 310 may include a system clock generating circuit 311, a command address generating circuit 312, and a data input/output circuit 313. The system clock generating circuit 311 may generate the system clock signal SCK and transmit the system clock signal SCK to the semiconductor apparatus 320 through the clock bus 301. The system clock generating circuit 311 may provide the system clock signal SCK to the command address generating circuit 312 and the data input and output (input/output) circuit 313. The system clock generating circuit 311 may include a clock generator, such as an oscillator, a phase-locked loop circuit, a delay-locked loop circuit, or the like, to generate the system clock signal SCK. The command address generating circuit 312 may generate the command address signal CA in response to a request REQ. The command address generating circuit 312 may change a logic value of the command address signal CA according to the type of the request REQ. The command address generating circuit 312 may transmit the command address signal CA to the semiconductor apparatus 320 through the command address bus 302. The command address generating circuit 312 may receive the system clock signal SCK, and may transmit the command address signal CA in synchronization with the system clock signal SCK.

The data input/output circuit 313 may receive internal data IND1 of the external device 310, and may generate the data DQ based on the internal data IND1. The data input/output circuit 313 may transmit the data DQ to the semiconductor apparatus 320 through the data bus 313. The data input/output circuit 313 may receive the data DQ transmitted from the semiconductor apparatus 320 through the data bus 303, and may generate the internal data IND1 based on the data DQ. The data input/output circuit 313 may receive the system clock signal SCK. The data input/output circuit 313 may transmit the data DQ to the semiconductor apparatus 320 in synchronization with the system clock signal SCK. The data input/output circuit 313 may receive the data DQ transmitted from the semiconductor apparatus 320 in synchronization with the system clock signal SCK.

The semiconductor apparatus 320 may include an internal clock generating circuit 321, a command address control circuit 322, and a data input and output (input/output) circuit 323. The internal clock generating circuit 321 may be connected to the external device 310 through the clock bus 301, and may receive the system clock signal SCK transmitted from the external device 310 through the clock bus 301. The internal clock generating circuit 321 may generate an internal clock signal CKOUT based on the system clock signal SCK. In one embodiment, the internal clock generating circuit 321 may delay the system clock signal SCK to generate the internal clock signal CKOUT, and the internal clock signal CKOUT may have the first frequency. In one embodiment, the internal clock generating circuit 321 may generate the internal clock signal CKOUT by dividing the frequency of the system clock signal SCK, and the internal clock signal CKOUT may have a second frequency lower than the first frequency. In one embodiment, the internal clock generating circuit 321 may generate the internal clock signal CKOUT by multiplying the frequency of the system clock signal SCK, and the internal clock signal CKOUT may have a third frequency higher than the first frequency. The internal clock generating circuit 321 may comprise at least one of a clock divider, a delay locked loop circuit, and a clock doubler. When the internal clock generating circuit 321 generates the internal clock signal CKOUT having a higher frequency than the system clock signal SCK, and the system clock signal SCK includes a first to fourth phase clock signal CKI, CKQ, CKIB, CKQB, the internal clock generating circuit 321 may include the clock doubler 100 of FIG. 1. In one embodiment, when the system clock signal SCK includes first and second clock signals CK1, CK2, the internal clock generating circuit 321 may include the clock generating circuit 200 of FIG. 3.

The command address control circuit 322 may be connected to the command address bus 302 to receive the command address signal CA transmitted from the external device 310. The command address control circuit 322 may generate an internal command address signal ICA based on the command address signal CA. The command address control circuit 322 may receive the internal clock signal CKOUT from the internal clock generating circuit 321. The command address control circuit 322 may generate the internal command address signal ICA by synchronising the command address signal CA to the internal clock signal CKOUT.

The data input/output circuit 323 may receive internal data IND2 of the semiconductor apparatus 320, and may generate the data DQ based on the internal data IND2. The data input/output circuit 323 may transmit the data DQ to the external device 310 through the data bus 303. The data input/output circuit 323 may receive the data DQ transmitted from the external device 310 through the data bus 303, and may generate the internal data IND2 based on the data DQ. The data input/output circuit 323 may receive the internal clock signal CKOUT from the internal clock generating circuit 321. The data input/output circuit 323 may transmit the data DQ to the external device 310 in synchronization with the internal clock signal CKOUT. The data input/output circuit 323 may receive the data DQ transmitted from the external device 310 in synchronization with the internal clock signal CKOUT.

The internal clock generating circuit 321 may include the clock doubler 100 of FIG. 1 or the clock generating circuit 200 of FIG. 3, and may generate the internal clock signal CKOUT having a higher frequency and a constant duty ratio from the system clock signal SCK. Thus, an internal circuit such as the command address control circuit 322 or the data input/output circuit 323 that receives the internal clock signal CKOUT can operate stably, and the operation reliability of the semiconductor apparatus 320 can be improved. Typically, the test device or test equipment may provide a clock signal having a lower frequency than the frequency at which the host device or semiconductor apparatus 320 can operate. Thus, when the external device 310 is the test device or test equipment, the external device 310 might not be able to provide the clock signal having a frequency high enough for the semiconductor apparatus 320 to operate. In order to verify the performance of the semiconductor apparatus 320, the semiconductor apparatus 320 needs to generate the internal clock signal CKOUT having a high frequency from the system clock signal SCK having a low frequency. If the internal clock signal generating circuit 321 is equipped with the clock doubler 100 of FIG. 1 or the clock generating circuit 200 of FIG. 3, the internal clock signal generating circuit 321 can generate the internal clock signal CKOUT having a stable frequency and duty ratio regardless of the duty cycle of the system clock signal SCK, thus enabling accurate performance verification of the semiconductor apparatus 320.

While certain embodiments have been described above, it will be understood to those skilled in the art that the embodiments described are by way of example only. Accordingly, the clock doubler, the clock generating circuit and the semiconductor system should not be limited based on the described embodiments. Rather, the clock doubler, the clock generating circuit and the semiconductor system described herein should only be limited in light of the claims that follow when taken in conjunction with the above description and accompanying drawings.

13

14

What is claimed is:

1. A clock doubler comprising:

a first triggering circuit configured to generate a first trigger clock signal that transitions from a first logic level to a second logic level in synchronization with a rising edge of a first phase clock signal and transitions from the second logic level to the first logic level in synchronization with a rising edge of a second phase clock signal;

a second triggering circuit configured to generate a second trigger clock signal that transitions from the first logic level to the second logic level in synchronization with a rising edge of a third phase clock signal and transitions from the second logic level to the first logic level in synchronization with a rising edge of a fourth phase clock signal; and a gating circuit configured to gate the first and second trigger clock signals to generate an output clock signal.

2. The clock doubler of claim 1, wherein the first to fourth phase clock signals sequentially have a constant phase difference.

3. The clock doubler of claim 1, wherein the first triggering circuit includes:

a first selection circuit configured to output one of the first and second phase clock signals as a first synchronization clock signal responsive to a complementary signal of the first trigger clock signal; and a first synchronization circuit configured to output the complementary signal of the first trigger clock signal in synchronization with the first synchronization clock signal as the first trigger clock signal.

4. The clock doubler of claim 3, wherein the second triggering circuit includes:

a second selection circuit configured to output one of the third and fourth phase clock signals as a second synchronization clock signal responsive to a complementary signal of the second trigger clock signal; and a second synchronization circuit configured to output the complementary signal of the second trigger clock signal in synchronization with the second synchronization clock signal as the second trigger clock signal.

5. The clock doubler of claim 1, wherein the gating circuit is configured to generate a pulse of the output clock signal whenever pulses of the first and second trigger clock signals is generated.

6. A clock doubler comprising:

a first triggering circuit configured to generate a first trigger clock signal having a pulse enabled during a period from a rising edge of a first phase clock signal to a rising edge of a second phase clock signal;

a second triggering circuit configured to generate a second trigger clock signal having a pulse enabled during a period from a rising edge of a third phase clock signal to a rising edge of a fourth phase clock signal; and a gating circuit configured to gate the first and second trigger clock signals to generate an output clock signal.

7. The clock doubler of claim 6, wherein the first to fourth phase clock signals sequentially have a constant phase difference.

8. The clock doubler of claim 6, wherein the first triggering circuit includes:

a first selection circuit configured to output one of the first and second phase clock signals as a first synchronization clock signal responsive to a complementary signal of the first trigger clock signal; and a first synchronization circuit configured to output the complementary signal of the first trigger clock signal in synchronization with the first synchronization clock signal as the first trigger clock signal.

9. The clock doubler of claim 8, wherein the second triggering circuit includes:

a second selection circuit configured to output one of the third and fourth phase clock signals as a second synchronization clock signal responsive to a complementary signal of the second trigger clock signal; and a second synchronization circuit configured to output the complementary signal of the second trigger clock signal in synchronization with the second synchronization clock signal as the second trigger clock signal.

10. The clock doubler of claim 6, wherein the gating circuit is configured to generate a pulse of the output clock signal whenever pulses of the first and second trigger clock signals is generated.

11. A clock doubler comprising:

a first selection circuit configured to output one of a first phase clock signal and a second phase clock signal as a first synchronization clock signal responsive to a complementary signal of a first trigger clock signal;

a first synchronization circuit configured to output the complementary signal of the first trigger clock signal as the first trigger clock signal responsive to the first synchronization clock signal;

a second selection circuit configured to output one of a third phase clock signal and a fourth phase clock signal as a second synchronization clock signal responsive to a complementary signal of a second trigger clock signal;

second a synchronization circuit configured to output the complementary signal of the second trigger clock signal as the second trigger clock signal responsive to the second synchronization clock signal; and a gating circuit configured to gate the first and second trigger clock signals to generate an output clock signal.

12. The clock doubler of claim 11, wherein the first to fourth phase clock signals sequentially have a constant phase difference.

13. The clock doubler of claim 11, wherein the first selection circuit is configured to output the first phase clock signal as the first synchronization clock signal when the complementary signal of the first trigger clock signal is at a first logic level, and is configured to output the second phase clock signal as the second synchronization clock signal when the complementary signal of the first trigger clock signal is at a second logic level.

14. The clock doubler of claim 11, wherein the first synchronization circuit is configured to output the complementary signal of the first trigger clock signal as the first trigger clock signal in synchronization with a rising edge of the first synchronization clock signal.

15. The clock doubler of claim 11, wherein the second selection circuit is configured to output the third phase clock signal as the second synchronization clock signal when the complementary signal of the second trigger clock signal is at a first logic level, and is configured to output the fourth phase clock signal as the second synchronization clock signal when the complementary signal of the second trigger clock signal is at a second logic level.

16. The clock doubler of claim 11, wherein the second synchronization circuit is configured to output the complementary signal of the second trigger clock signal as the second trigger clock signal in synchronization with a rising edge of the second synchronization clock signal.

17. The clock doubler of claim 11, wherein the gating circuit is configured to generate a pulse of the output clock signal each time a pulse of the first and second trigger clock signals is generated.

18. A clock doubler comprising:

a first multiplexer configured to output one of a first phase clock signal and a second phase clock signal as a first synchronization clock signal responsive to a complementary signal of a first trigger clock signal;

a first flip-flop including a clock terminal receiving the first synchronization clock signal, a negative output terminal outputting the complementary signal of the first trigger clock signal, an input terminal coupled with the negative output terminal, and a positive output terminal outputting the first trigger clock signal;

a second multiplexer is configured to output one of a third phase clock signal and a fourth phase clock signal as a second synchronization clock signal responsive to a complementary signal of a second trigger clock signal;

a second flip-flop including a clock terminal receiving the second synchronization clock signal, a negative output terminal outputting the complementary signal of the second trigger clock signal, an input terminal coupled with the negative output terminal, and a positive output terminal outputting the second trigger clock signal; and a NAND gate receiving the first and second trigger clock signals to output an output clock signal.

\* \* \* \* \*